US012620892B2

(12) United States Patent
Shin et al.

(10) Patent No.: US 12,620,892 B2
(45) Date of Patent: May 5, 2026

(54) POWER SUPPLY, ELECTRONIC DEVICE, AND METHOD FOR CONTROLLING SAME

(71) Applicant: SAMSUNG ELECTRONICS CO., LTD., Suwon-si (KR)

(72) Inventors: Jonghyun Shin, Suwon-si (KR); Youngjae Park, Suwon-si (KR); Junghoon Lee, Suwon-si (KR); Teaho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 403 days.

(21) Appl. No.: 18/196,596

(22) Filed: May 12, 2023

(65) Prior Publication Data

US 2023/0283191 A1 Sep. 7, 2023

Related U.S. Application Data

(63) Continuation of application No. PCT/KR2021/019183, filed on Dec. 16, 2021.

(30) Foreign Application Priority Data

Feb. 18, 2021 (KR) ........................ 10-2021-0022075

(51) Int. Cl.
*H02M 1/32* (2007.01)
*H02M 1/42* (2007.01)
(Continued)

(52) U.S. Cl.
CPC ........... *H02M 1/327* (2021.05); *H02M 5/458* (2013.01); *H05K 7/20945* (2013.01); *H02M 1/4225* (2013.01)

(58) Field of Classification Search
CPC .... H02M 1/327; H02M 1/4225; H02M 5/458; H05K 7/20945
See application file for complete search history.

(56) References Cited

U.S. PATENT DOCUMENTS 7,607,827 B2 10/2009 Karikomi et al.
7,715,214 B2 5/2010 Kishimoto et al.
(Continued)

FOREIGN PATENT DOCUMENTS

EP 2 835 538 B1 9/2017
JP 2005-269832 9/2005
(Continued)

OTHER PUBLICATIONS

International Search Report, PCT/ISA/210, dated Apr. 12, 2022, in PCT Application No. PCT/KR2021/019183.
(Continued)

*Primary Examiner* — Jue Zhang
(74) *Attorney, Agent, or Firm* — STAAS & HALSEY LLP

(57) ABSTRACT

An electronic device in accordance with one embodiment may include a load that receives power and performs an operation; and a power supply that supplies power to the load, the power supply including: a rectifier configured to rectify an input alternating current (AC) voltage; a converter including at least one first switching element and configured to convert the rectified input AC voltage into a direct current (DC) voltage; an inverter including a plurality of second switching elements and configured to convert the DC voltage into an AC voltage; a plurality of temperature sensors configured to detect the temperature of each of a plurality of switching elements including the at least one first switching element and the plurality of second switching elements; and a processor configured to determine whether a temperature failure occurs in the plurality of switching elements based on a temperature difference between the plurality of switching elements or a temperature variation amount of each of the plurality of switching elements and performs temperature
(Continued)

protection control on the plurality of switching elements based on determining that the temperature failure occurs.

18 Claims, 10 Drawing Sheets

(51) Int. Cl.
    *H02M 5/458*       (2006.01)
    *H05K 7/20*        (2006.01)

(56)           References Cited

U.S. PATENT DOCUMENTS

| | | |
|---|---|---|
| 8,319,463 B2 | 11/2012 | Sasaki et al. |
| 9,605,686 B2 | 3/2017 | Hamada et al. |
| 9,712,071 B2 | 7/2017 | Yuasa et al. |
| 10,077,910 B2 | 9/2018 | Lee et al. |
| 10,707,860 B1 | 7/2020 | Miyahara |

FOREIGN PATENT DOCUMENTS

| | | | |
|---|---|---|---|
| JP | 2008-22648 | | 1/2008 |
| JP | 2011-10480 | | 1/2011 |
| JP | 2012-139056 | | 7/2012 |
| JP | 2012139056 A | * | 7/2012 |
| JP | 2013-23305 | | 2/2013 |
| JP | 2013023305 A | * | 2/2013 |
| JP | 2013-106489 | | 5/2013 |
| JP | 2015-208081 | | 11/2015 |
| JP | 2016-127435 | | 7/2016 |
| JP | 2017-38427 | | 2/2017 |
| JP | 2017-184368 | | 10/2017 |
| JP | 2020-39211 | | 3/2020 |
| KR | 10-0733313 | | 6/2007 |
| KR | 10-2009-0060023 | | 6/2009 |
| KR | 10-0998277 | | 12/2010 |
| KR | 10-2017-0002349 | | 1/2017 |
| KR | 10-2019-0040425 | | 4/2019 |
| KR | 10-2020-0046849 | | 5/2020 |

OTHER PUBLICATIONS

Written Opinion, PCT/ISA/237, dated Apr. 12, 2022, in PCT Application No. PCT/KR2021/019183.
Machine Translation of Shuichi Nojima, JP 2013-23305, Feb. 4, 2013.
Machine Translation of Hiroshi Inamura, JP 2012-139056, Jul. 19, 2012.
Office Action dated May 26, 2025, in Korean Application No. 10-2021-0022075.

* cited by examiner

FIG. 1

SWITCHING ELEMENT TEMPERATURE (NORMAL CONDITION)

SWITCHING ELEMENT TEMPERATURE (TEMPERATURE FAILURE CONDITION)

LOAD OPERATING FREQUENCY

INPUT
CURRENT

SWITCHING
ELEMENT
TEMPERATURE
VARIATION
AMOUNT

SWITCHING
ELEMENT
TEMPERATURE

ERROR
COUNT

INPUT CURRENT

0 ────────────────────→ TIME

SWITCHING ELEMENT TEMPERATURE VARIATION AMOUNT

0 ────────────────────→ TIME

|←───── A ─────→|←── B ──→|←─ C ─→|

SWITCHING ELEMENT TEMPERATURE

0 ────────────────────→ TIME

|←───── A ─────→|←── B ──→|←─ C ─→|

ERROR COUNT

0 ────────────────────→ TIME

| | FIRST SWITCHING ELEMENT TEMPERATURE | | TEMPERATURE FAILURE DETERMINATION |
| --- | --- | --- | --- |
| | SECOND SWITCHING ELEMENT TEMPERATURE | | OPERATING FREQUENCY |

POWER SUPPLY, ELECTRONIC DEVICE, AND METHOD FOR CONTROLLING SAME

CROSS-REFERENCE TO RELATED APPLICATION(S)

This application is a continuation of International Application PCT/KR2021/019183, filed on Dec. 16, 2021, and claims foreign priority to Korean Patent Application No. 10-2021-0022075, filed on Feb. 18, 2021, the disclosures of which are incorporated by reference herein in their entireties.

BACKGROUND

1. Field

Embodiments of the present disclosure relate to a power supply for supplying power and an electronic device including the same.

2. Description of Related Art

In general, a power supply may include a plurality of switching elements. The plurality of switching elements may be located in a converter to convert an AC voltage into a DC voltage, and may be located in an inverter to convert the DC voltage into a three-phase voltage.

Heat may be generated in the power supply due to the operation of the plurality of switching elements, and a heat sink, such as a heat sink plate, can be used to cool the power supply. For this, the plurality of switching elements may be provided in a structure fastened to the heat sink.

However, when the fastening state of the switching element to the heat sink is incomplete or the fastening force is reduced due to vibrations and the like, local thermal runaway may occur in the switching element, which may lead to system failure due to device destruction.

SUMMARY

An electronic device in accordance with one embodiment may include a load that receives power and performs an operation; and a power supply that supplies power to the load, the power supply including: a rectifier configured to rectify an input alternating current (AC) voltage; a converter including at least one first switching element and configured to convert the rectified input AC voltage into a direct current (DC) voltage; an inverter including a plurality of second switching elements and configured to convert the DC voltage into an AC voltage; a plurality of temperature sensors configured to detect the temperature of each of a plurality of switching elements including the at least one first switching element and the plurality of second switching elements; and a processor configured to determine whether a temperature failure occurs in the plurality of switching elements based on a temperature difference between the plurality of switching elements or a temperature variation amount of each of the plurality of switching elements and performs temperature protection control on the plurality of switching elements based on determining that the temperature failure occurs.

The processor may determine that the temperature failure occurs based on the temperature variation amount in any one of the plurality of switching elements being maintained at a predetermined value or more for a predetermined time.

The processor may determine that the temperature failure occurs based on the temperature difference between any one of the plurality of switching elements and another one of the plurality of switching elements exceeding a predetermined temperature difference for a predetermined time.

The processor may adjust the predetermined temperature difference in an increasing direction in response to the input AC voltage being increased.

The processor may determine that the temperature failure occurs based on a variation amount of the temperature difference between any one of the plurality of switching elements and another one of the plurality of switching elements exceeding a predetermined value and being maintained for a predetermined time.

The processor may perform the temperature protection control by lowering a supplied current to the plurality of switching elements based on determining that the temperature failure occurs.

The power supply may further include a cooling device that lowers temperature of the plurality of switching elements, and the processor may perform the temperature protection control by increasing cooling performance of the cooling device based on determining that the temperature failure occurs.

The cooling device may be a refrigerant cooling-type cooling device, and the processor may increase the cooling performance of the cooling device by increasing a refrigerant flow rate of the cooling device.

The cooling device may be an air cooling-type cooling device, and the processor may increase the cooling performance of the cooling device by increasing the air volume of the cooling device.

The power supply may further include a current sensor that detects an input current of the input AC voltage, and the processor may determine whether the temperature failure occurs in the plurality of switching elements based on a variation amount of the input current being less than a predetermined value.

A method of controlling an electronic device including a load that receives power and performs an operation, and a power supply that supplies power to the load, the rectifier, a converter having at least one first switching element, and an inverter having a plurality of second switching elements in accordance with one embodiment may include controlling the converter to convert an input AC voltage rectified by the rectifier into a DC voltage; controlling the inverter to convert the DC voltage into an AC voltage; detecting a temperature of each of a plurality of switching elements including the at least one first switching element and the plurality of second switching elements; determining whether the temperature failure occurs in the plurality of switching elements based on a temperature difference between the plurality of switching elements or a temperature variation amount of each of the plurality of switching elements; and performing temperature protection control on the plurality of switching elements based on determining that the temperature failure occurs.

The determining of whether the temperature failure occurs may include determining that the temperature failure occurs based on the temperature variation amount in any one of the plurality of switching elements being maintained at a predetermined value or more for a predetermined time.

The determining of whether the temperature failure occurs may include determining that the temperature failure occurs based on the temperature difference between any one of the plurality of switching element and another one of the plurality of switching elements exceeding a predetermined temperature difference for a predetermined time.

The control method may further include adjusting the predetermined temperature difference in an increasing direction in response to the input AC voltage being increased.

The determining of whether the temperature failure occurs may include determining that the temperature failure occurs based on a variation amount of the temperature difference between any one of the plurality of switching elements and another one of the plurality of switching elements exceeding a predetermined value and being maintained for a predetermined time.

The performing of the temperature protection control may include performing the temperature protection control by lowering a supplied current to the plurality of switching elements based on determining that the temperature failure occurs.

The power supply may further include a cooling device that lowers the temperature of the plurality of switching elements, and the performing of the temperature protection control may include performing the temperature protection control to increase cooling performance of the cooling device based on determining that the temperature failure occurs.

The cooling device may be a refrigerant cooling type cooling device, and the performing of the temperature protection control may include performing the temperature protection control to increase the cooling performance of the cooling device by increasing the refrigerant flow rate of the cooling device.

The power supply may further include a current sensor that detects an input current of the input AC voltage; and the determining of whether the temperature failure occurs may include determining whether the temperature failure occurs based on the variation amount of the input current being less than a predetermined value.

BRIEF DESCRIPTION OF THE DRAWINGS

Aspects, features, and advantages of certain embodiments of the present disclosure will be more apparent from the following description taken in conjunction with the accompanying drawings, in which:

FIG. 1 is a block diagram of a power supply according to one embodiment.

DETAILED DESCRIPTION

Figure 2:
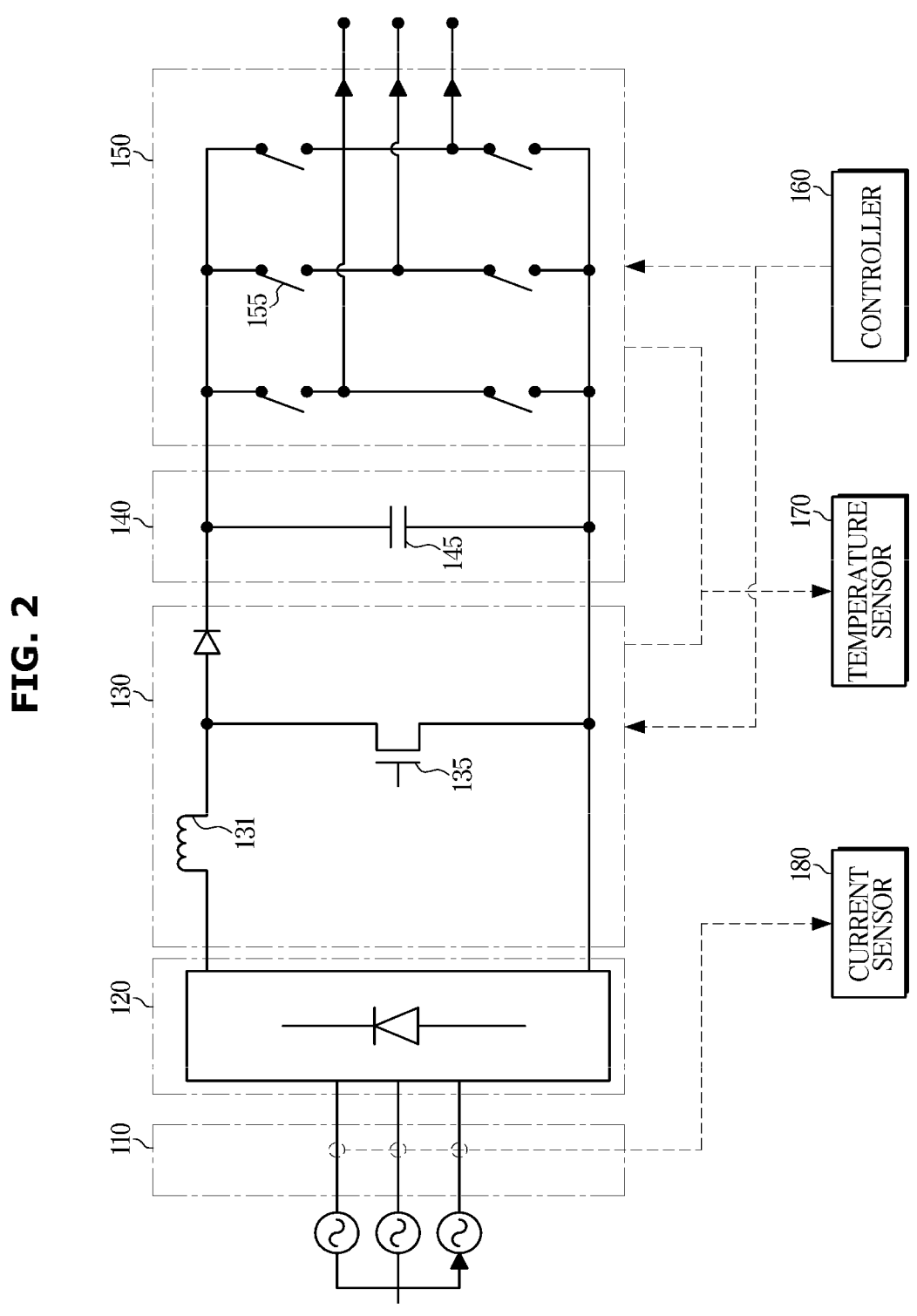
FIG. 2 is a circuit diagram of the power supply according to one embodiment.

Embodiments described in this specification and configurations shown in the drawings are only one preferred example of the disclosed embodiments, and there may be various modifications that can replace the embodiments and the drawings in this specification at the time of filing the present application.

Throughout this specification, when a part is said to be "connected" to another part, this includes not only the case of being directly connected but also the case of being indirectly connected, and indirect connection includes being connected through a wireless communication network.

In addition, terms used in this specification are used to describe the embodiments and are not intended to limit and/or restrict the disclosed embodiments. Singular expressions include plural expressions unless the context clearly indicates otherwise. In this specification, terms such as "include" or "have" are intended to indicate that the presence of a feature, number, step, operation, component, part, or combination thereof described in the specification, but they do not preclude the possibility of the presence or addition of one or more other features, numbers, steps, operations, components, parts, or combinations thereof.

In addition, terms including ordinal numbers such as "first" and "second" used may be used to describe various components, but the components are not limited by the terms, and the terms are used only for the purpose of distinguishing one component from another. For example, a first element may be called a second element, and similarly, a second element may be called a first element without departing from the scope of the embodiments.

In addition, terms such as "~unit", "~group", "~block", "~member", and "~module" may mean a unit that processes at least one function or operation. For example, the terms such as "field-programmable gate array (FPGA)/application specific integrated circuit (ASIC)" may refer to at least one piece of hardware, at least one piece of software stored in a memory, or at least one process processed by a processor.

The codes attached to each step are used to identify each step, and these codes do not indicate the order of each step, and each step can be carried out in a different order from the specified order unless a specific order is clearly stated in the context.

According to at least one embodiment, a power supply and an electronic device capable of protecting a switching element by detecting a temperature failure condition based on a temperature variation amount of the switching element or a temperature difference between a plurality of switching elements and performing temperature protection control are provided.

Moreover, according to a power supply and electronic device according to at least one embodiment, switching elements can be protected and system failure can be prevented by detecting a temperature failure condition based on the temperature variation amount of a switching element or the temperature difference between a plurality of switching elements and performing temperature protection control.

Hereinafter, embodiments according to the present disclosure will be described in detail with reference to the accompanying drawings.

Figure 1:
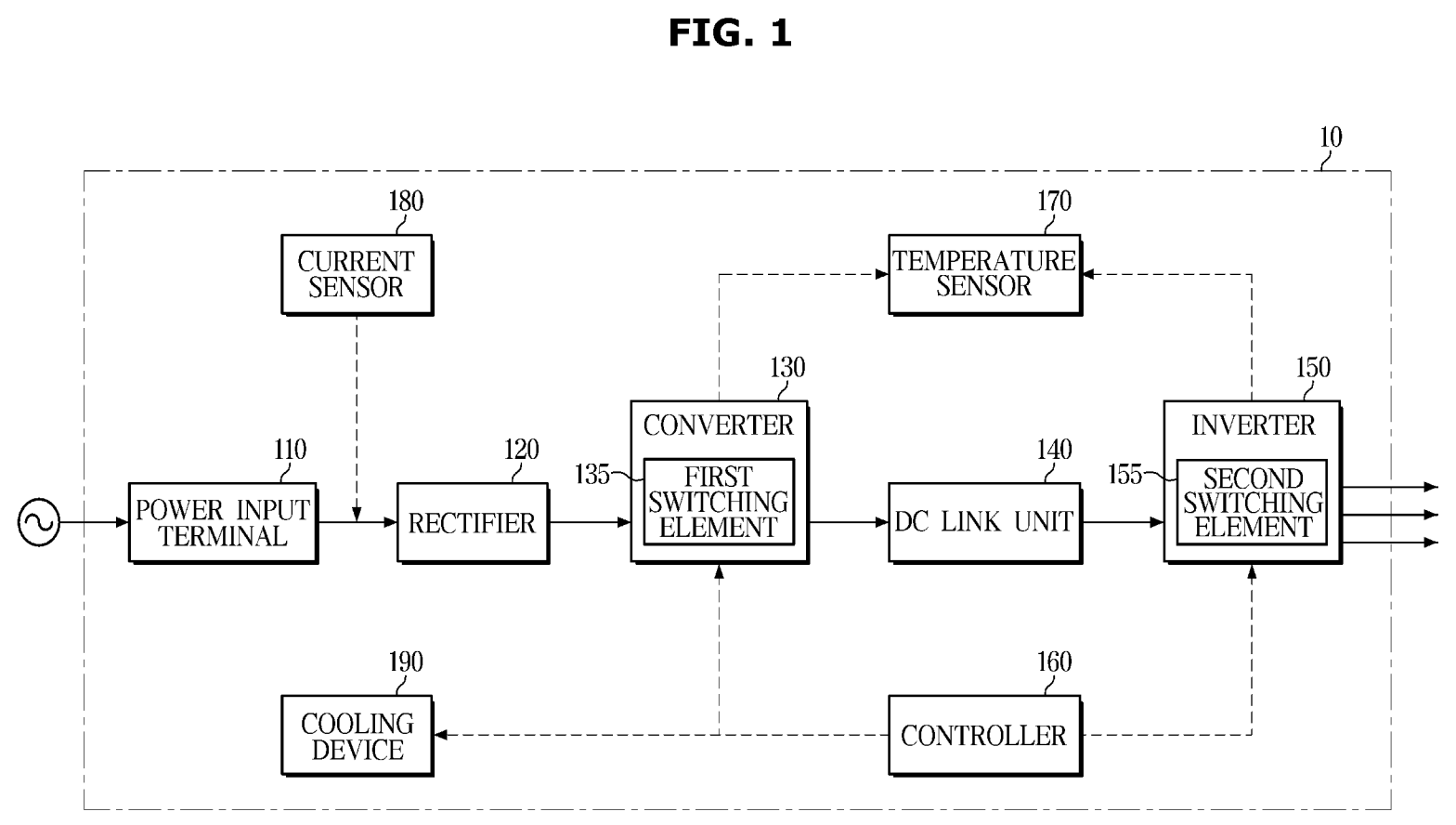

FIG. 1 is a block diagram of a power supply according to one embodiment, and FIG. 2 is a circuit diagram of the power supply according to one embodiment.

Referring to FIG. 1, a power supply 10 according to one embodiment includes a power input terminal 110 connected to an external power source, a rectifier 120 that rectifies an input AC voltage supplied from the external power source, a converter 130 that converts the rectified AC voltage into a DC voltage following a predetermined voltage, a DC link unit 140 supplied with the DC voltage output from the converter 130, and an inverter 150 that converts the DC voltage received from the DC link unit 140 into a three-phase voltage.

In addition, the power supply 10 includes a controller 160 for controlling at least one first switching element 135 included in the converter 130 and a plurality of second switching elements 155 included in the inverter 150 and a temperature sensor 170 for sensing a temperature of each of the first switching element 135 and the second switching elements 155, a current sensor 180 for sensing an input current of the input AC voltage, and a cooling device 190 for performing temperature protection control.

The power input terminal 110 according to one embodiment may receive an input AC voltage input from the external power source. At this time, the external power source may be provided as a single-phase voltage source or a three-phase voltage source, but there are no restrictions on their types.

The rectifier 120 according to one embodiment may rectify the input AC voltage. The rectifier 120 may be supplied with AC power from the power input terminal 110 and rectify the supplied AC power. In other words, the rectifier 120 may be connected to the power input terminal 110 to rectify the AC voltage input from the power input terminal 110.

At this time, depending on the embodiment, the rectifier 120 may be provided as a diode bridge and may include a switching element replacing the diode.

In other words, according to an embodiment, the rectifier 120 may include four diodes in the form of a full bridge.

Moreover, according to an embodiment, the rectifier 120 may include four switching elements in the form of a full bridge, and it may be equivalent to a synchronous rectifier that rectifies an AC voltage through synchronization between switching elements.

However, the type of rectifier 120 is not limited to the above examples, and any type capable of rectifying an input AC voltage can be utilized without limitation.

The converter 130 according to one embodiment may be connected to the rectifier 120 to be supplied with the rectified input AC voltage, and the rectified input AC voltage may be converted into a DC voltage following a predetermined voltage.

The converter 130 may include at least one first switching element 135, and the rectified AC voltage may be converted into a DC voltage following a predetermined voltage by turning on or off at least one switching element under the control of the controller 160.

In other words, the converter 130 may boost the level of the rectified input AC voltage by the operation of at least one switching element 135 to a predetermined voltage, and a power factor may be improved by synchronizing the phases of voltage and current. In other words, the converter 130 may be equivalent to a power factor correction (PFC) boost converter, and the DC voltage may exceed a peak value of the rectified AC voltage.

For example, the converter 130, as shown in FIG. 2, may include an inductor 131 provided on a line connected to the rectifier 120 and the first switching element 135 provided between a node on the inductor 131 side and a node on the ground side. However, the circuit configuration of the converter 130 is not limited thereto, and there is no limitation as long as it is a circuit configuration of a known converter for power factor improvement and boosting voltage.

The DC link unit 140 according to one embodiment may be connected to the converter 130 to be supplied with the DC voltage following a predetermined voltage. Through this, the DC link unit 140 may supply the DC voltage to the connected inverter 150.

As shown in FIG. 2, the DC link unit 140 may be provided with a capacitor 145, and the capacitor 145 may be charged with the DC voltage supplied from the converter 130 to store the DC voltage.

The inverter 150 according to one embodiment may include the plurality of second switching elements 155 and convert the DC voltage received from the DC link unit 140 into the three-phase voltage.

Specifically, as shown in FIG. 2, the inverter 150 may include two second switching elements 155 connected in series for the U phase, two second switching elements 155 connected in series for the V phase, and two second switching elements 155 connected in series for the W phase.

The three-phase voltage output from the inverter 150 may be supplied to a load (e.g.: a compressor or a motor) connected through the output terminal.

At this time, a plurality of switching elements 135 and 155 including both the first switching element 135 and the plurality of second switching elements 155 may include a bipolar junction transistor (BJT), a metal-oxide-semiconductor field effect transistor (MOSFET), an insulated gate bipolar transistor (IGBT), a thyristor, etc. However, the type of switching element is not limited to the above examples, and any element that performs a switching operation may be included without limitation.

The controller 160 according to one embodiment may control on/off of each of the first switching element 135 and the second switching element 155 according to the required voltage at the load.

Furthermore, the controller 160 according to one embodiment may determine whether a temperature failure occurs in the plurality of switching elements 135 and 155 based on the temperature variation amount of each of the plurality of switching elements 135 and 155 or the temperature difference between the plurality of switching elements 135 and 155, and when it is determined that the temperature failure occurs, temperature protection control may be performed on the plurality of switching elements. Determination of the temperature failure condition in the plurality of switching elements 135 and 155 and execution of the temperature protection control will be described in detail below.

The controller 160 may include at least one memory for storing a program for performing the above-described operation and an operation to be described below, and at least one processor for executing the stored program.

The temperature sensor 170 according to one embodiment may be provided in a plurality to detect the temperature of each of the plurality of switching elements 135 and 155, and may be provided to correspond to each of the plurality of switching elements 135 and 155. At this time, the controller 160 may determine the temperature of each of the plurality of switching elements 135 and 155 based on outputs transmitted from the plurality of temperature sensors 170.

The current sensor 180 according to one embodiment may detect the input current of the input AC voltage, and according to an embodiment, the input AC voltage may be detected based on the input current.

For this, as shown in FIG. 2, the current sensor 180 may detect a current in a connection line between the power input terminal 110 and the rectifier 120.

However, the position of the current sensor 180 is not limited to the above example, and according to an embodiment, the current in a connection line between the rectifier 120 and the converter 130 may be detected or the current in a connection line between the converter 130 and the DC link unit 140 may be detected.

The current sensor 180 may transmit a current value of the detected input current to the controller 160, and the controller 160 may determine a variation amount of the input current based on the current value of the input current transmitted from the current sensor 180.

The cooling device 190 according to one embodiment may cool the power supply 10, and the temperature protection operation may be performed under the control of the controller 160.

Specifically, the cooling device 190 may improve cooling performance according to the temperature protection control of the controller 160.

According to an embodiment, the cooling device 190 may be provided as a refrigerant cooling type cooling device, and the refrigerant flow rate may be increased to increase cooling performance according to the temperature protection control of the controller 160.

Also, according to an embodiment, the cooling device 190 may be provided as an air cooling type cooling device, and the air volume may be increased to increase cooling performance according to the temperature protection control of the controller 160.

In the above, each configuration of the power supply 10 has been described. Hereinafter, how the power supply 10 performs the temperature protection control based on the temperature variation amount of the plurality of switching elements 135 and 155 or the temperature difference between the plurality of switching elements 135 and 155 will be described in detail.

Figure 3:
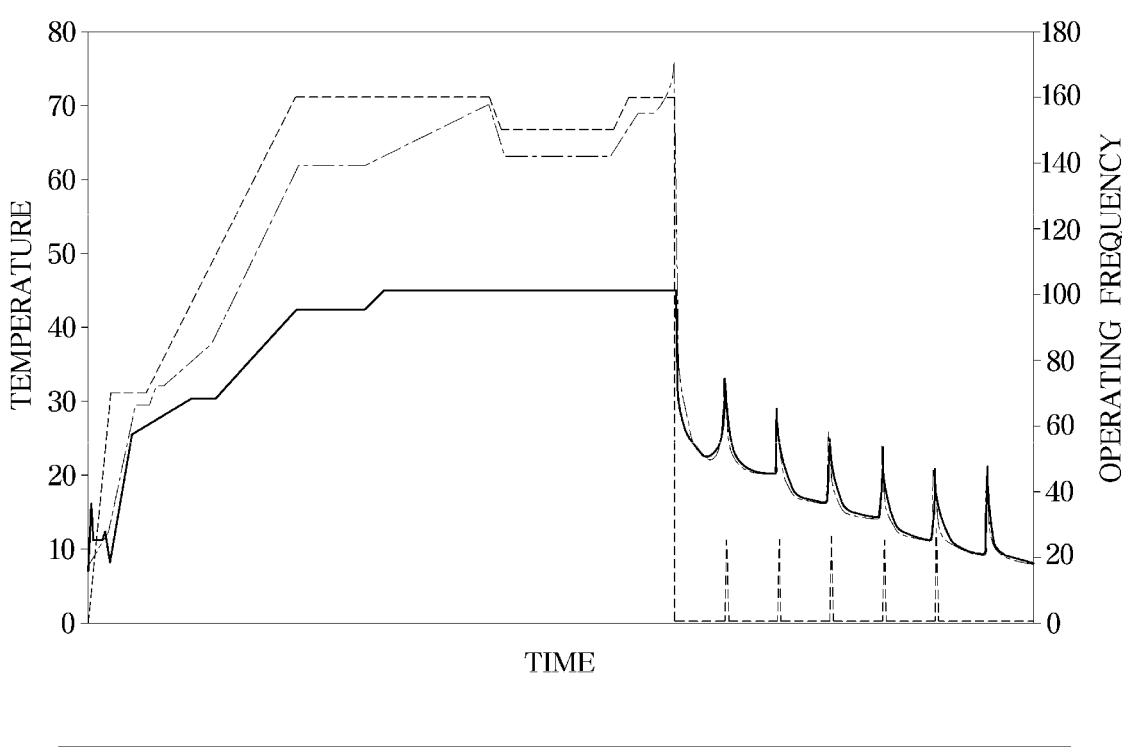
FIG. 3 illustrates the temperature variation of a switching element depending on whether or not a temperature failure occurs in the power supply according to one embodiment.

FIG. 3 illustrates the temperature change of the switching elements 135 and 155 depending on whether or not a temperature failure occurs in the power supply 10 according to one embodiment.

Each of the least one first switching element 135 included in the converter 130 and the plurality of second switching elements 155 included in the inverter 150 may be provided in a structure fastened to a heat sink such as a heat sink plate.

In other words, all of the plurality of switching elements 135 and 155 included in the power supply 10 may be fastened to the heat sink.

However, when the fastening of the switching elements 135 and 155 to the heat sink is incomplete or the fastening force is reduced due to vibrations and the like, local thermal runaway may occur in the switching elements 135 and 155, which may lead to system failure due to device destruction.

Specifically, as shown in FIG. 3, in a normal condition where the switching elements 135 and 155 are normally fastened to the heat sink, the temperature of the switching elements 135 and 155 does not rise above a certain value, whereas, in a temperature failure condition where the fastening between the switching elements 135 and 155 and the heat sink is incomplete, the temperature of the switching elements 135 and 155 may be higher than in the normal condition.

Thus, according to an embodiment, the controller 160 may determine whether the temperature failure occurs by sensing the temperature variation amount of the switching elements 135 and 155 and perform temperature protection control.

Figure 4:
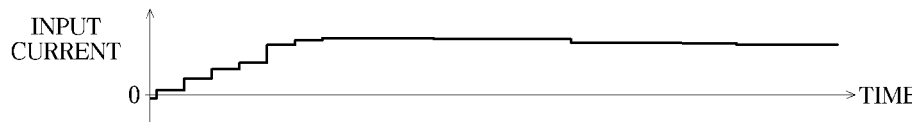
FIG. 4 illustrates the temperature variation amount of the switching element in a normal condition in the power supply according to one embodiment.
Figure 4:
Figure 4:
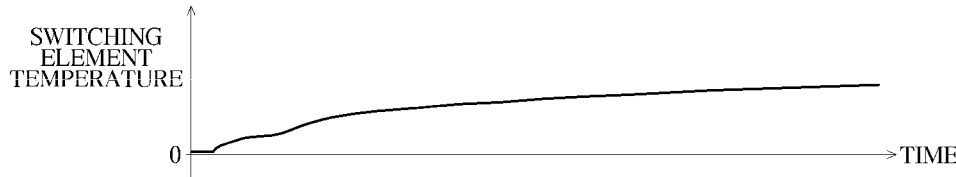
Figure 4:
Figure 5:
FIG. 5 illustrates the temperature variation amount of the switching element in the temperature failure condition in the power supply according to one embodiment.
Figure 5:
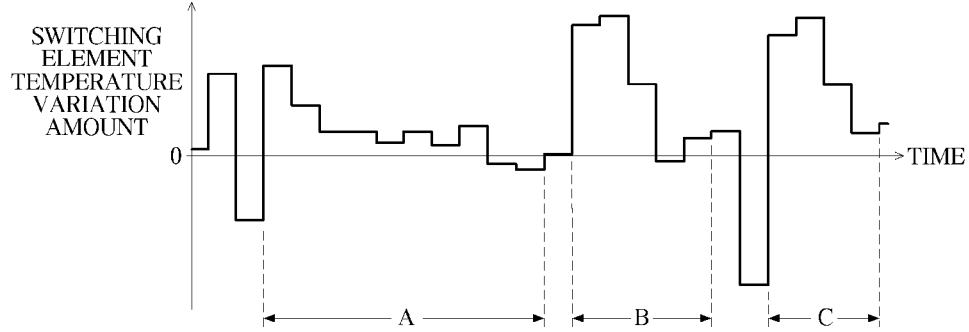
Figure 5:
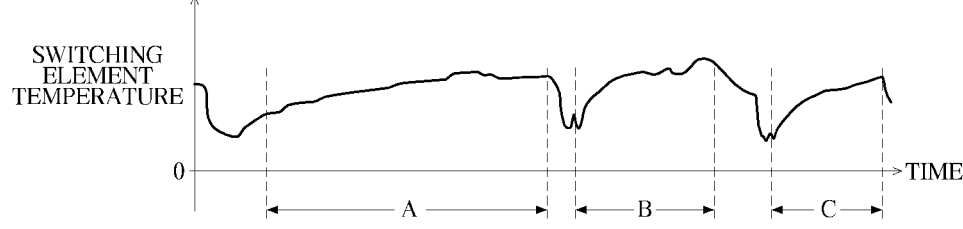
Figure 5:
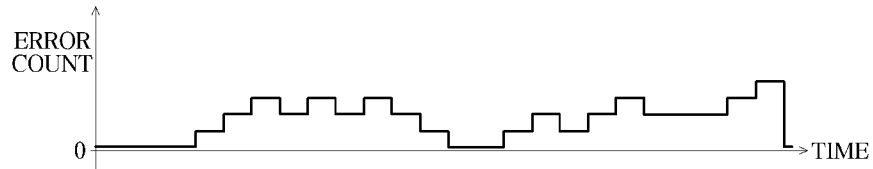

FIG. 4 illustrates the temperature variation amount of the switching elements 135 and 155 in the normal condition in the power supply 10 according to one embodiment, and FIG. 5 illustrates the temperature variation amount of the switching elements 135 and 155 in the temperature failure condition in the power supply 10 according to one embodiment.

Referring to FIG. 4, when the power supply 10 according to one embodiment supplies power to a load, the temperature of the switching elements 135 and 155 may be increased by the switching operation.

As shown in FIG. 4, when the input current input to the power supply 10 is kept constant while the switching elements 135 and 155 are normally fastened to the heat sink, the temperature variation amount of the switching elements 135 and 155 may be maintained at a constant level. At this time, the temperature variation amount may mean the temperature variation amount for a unit time.

In other words, since the rapid temperature rise of the switching elements 135,155 may be suppressed by cooling by the heat sink, the temperature of the switching elements 135 and 155 may rise with a constant slope.

However, when the fastening of the switching elements 135 and 155 to the heat sink is incomplete or the fastening force is reduced due to vibrations and the like, local thermal runaway may occur in the switching elements 135 and 155.

For example, as shown in FIG. 5, when the temperature of the switching elements 135 and 155 rises rapidly (section A, section B, and section C), the temperature variation amount of the switching elements 135 and 155 may be maintained higher than a predetermined value (e.g., 1.5° C./s), and the controller 160 may determine that a temperature failure occurs when the temperature variation amount of the switching elements 135 and 155 is maintained at a predetermined value or more for a predetermined time (e.g., 20 seconds), add up an error count, and cool the switching elements 135 and 155 by performing temperature protection control.

In other words, when the fastening condition of any one of the plurality of switching elements 135 and 155 to the heat sink is poor, thermal runaway may occur in the corresponding switching element, and since the temperature of the entire power supply 10 cannot represent the temperature of the corresponding switching element, thermal runaway in the corresponding switching element cannot be prevented by temperature protection control based on the temperature of the power supply 10.

Thus, the power supply 10 of the present disclosure may perform the temperature protection control when the temperature variation amount in any one of the switching elements is maintained at a predetermined value or more for a predetermined time while continuously sensing the temperature variation amount of each of the plurality of switching elements 135 and 155.

Specifically, the controller 160 may determine that the temperature failure occurs in the corresponding switching element when the temperature variation amount in any one of the plurality of switching elements 135 and 155 included in each of the converter 130 and the inverter 150 is maintained at a predetermined value or more for a predetermined time and perform the temperature protection control for cooling the corresponding switching element. At this time, according to an embodiment, the controller 160 may adjust the predetermined value to be compared with the temperature variation amount of the switching elements in an increasing direction in proportion to the magnitude of the input current or the input AC voltage.

For example, as shown in section A in FIG. 5, the controller 160 may perform temperature protection control for cooling the corresponding switching element when the temperature of the switching element rapidly rises and the temperature variation amount in the switching element is maintained at a predetermined value or more for a predetermined time. Through this, the temperature of the switching elements may be lowered as shown between section A and section B in FIG. 5.

According to an embodiment, the controller 160 may determine whether a temperature failure occurs in the plurality of switching elements 135 and 155 when the variation amount of the input current is less than a predetermined value. In other words, the power supply 10 may determine a temperature failure condition based on the temperature variation amount of the switching elements only when the input current is constant, considering that the temperature of the switching elements 135 and 155 also varies when the input current is varied.

According to an embodiment, the controller 160 may perform temperature protection control by lowering the supplied current to the plurality of switching elements 135 and 155 when it is determined that the temperature failure condition occurs. For example, the controller 160 may control the switching of the plurality of switching elements 135 and 155 such that a switching frequency of the plurality of switching elements 135 and 155 decreases or the off time of the plurality of switching elements 135 and 155 increases.

According to an embodiment, the controller 160 may perform the temperature protection control by increasing the cooling performance of the cooling device 190 when it is determined that the temperature failure condition occurs. For example, the controller 160 may increase the cooling performance of the cooling device 190 by increasing the flow rate of the refrigerant of the cooling device 190 when the cooling device 190 is a refrigerant cooling-type cooling device. In addition, the controller 160 may increase the cooling performance of the cooling device 190 by increasing the air volume of the cooling device 190 when the cooling device 190 is an air cooling-type cooling device.

According to an embodiment, the controller 160 may perform the temperature protection control multiple times, and when it is determined that the temperature failure condition occurs in the switching elements 135 and 155 even when the temperature protection control proceeds a predetermined number of times or more, the power supply operation may be terminated. For example, the controller 160, as shown in FIG. 5, may terminate the power supply operation when the temperature failure condition of the switching elements 135 and 155 is determined again as shown in section C after performing the temperature protection control based on the determination of the temperature failure condition in each of section A and section B.

In the above, it has been described in detail that the power supply 10 performs temperature protection control based on the temperature variation amount of the switching elements 135 and 155. Hereinafter, it will be described in detail that the power supply 10 performs temperature protection control based on the temperature difference between the switching elements 135 and 155.

Figure 6:
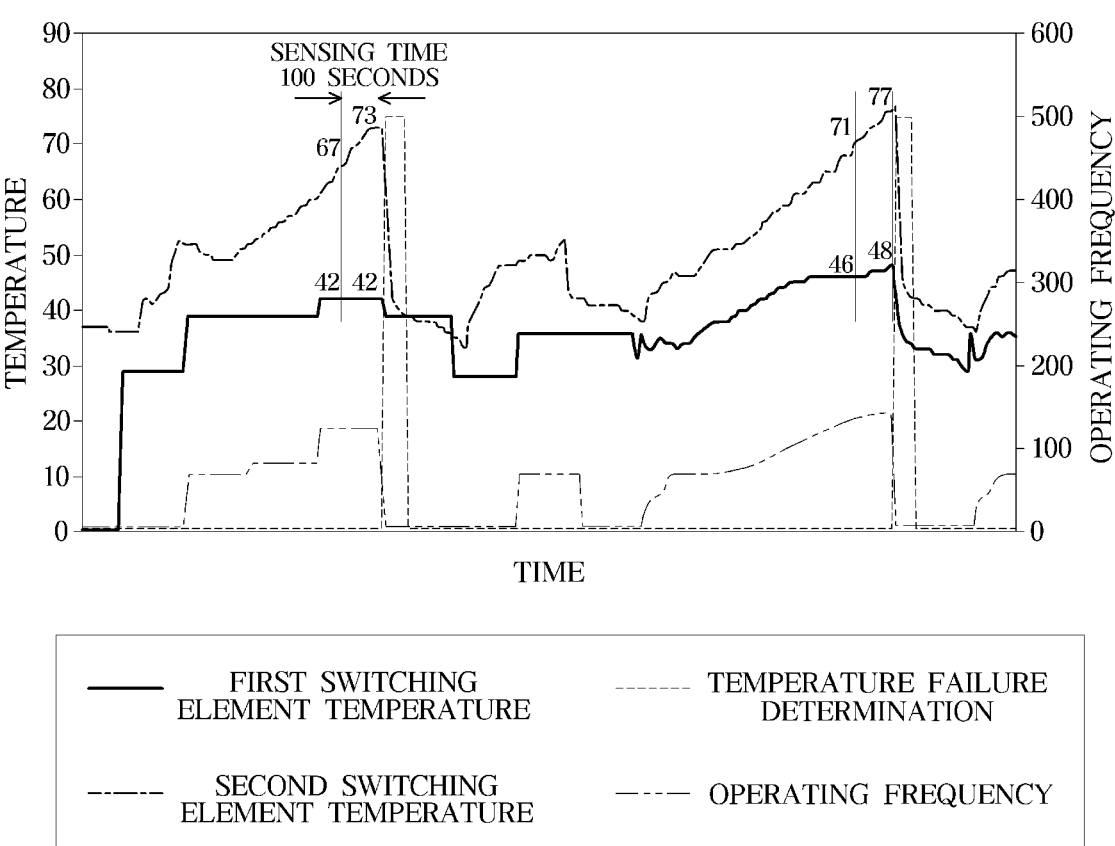
FIG. 6 is a diagram for describing a case in which the temperature failure is determined based on a temperature difference between the switching elements in the power supply according to an embodiment.
Figure 7:
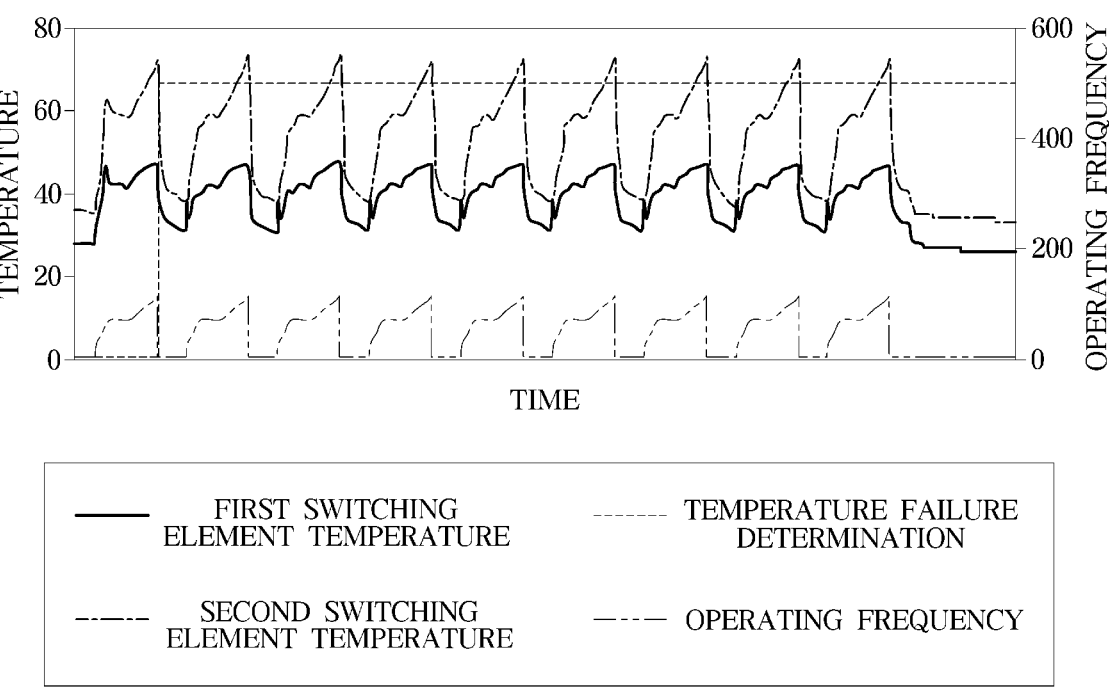
FIG. 7 is a diagram showing a case where the power supply according to one embodiment terminates the supply of power to a load when the temperature failure occurs.

FIG. 6 is a diagram for describing a case in which the temperature failure is determined based on the temperature difference between the switching elements in the power supply 10 according to one embodiment, and FIG. 7 is a diagram showing a case where the power supply 10 according to one embodiment terminates the supply of power to a load when the temperature failure occurs.

Referring to FIG. 6, the power supply 10 according to one embodiment may determine whether a temperature failure condition occurs based on the temperature difference between the plurality of switching elements 135 and 155 and perform temperature protection control when it is determined that the temperature failure condition occurs.

When each of the plurality of switching elements 135 and 155 is normally fastened to the heat sink as a normal condition, according to the cooling of the heat sink, the temperature difference between the plurality of switching elements 135 and 155 may not be large.

At this time, when any one of the plurality of switching elements 135 and 155 is incompletely fastened to the heat sink or the fastening force is reduced due to vibrations and the like, the corresponding switching element may have a large temperature difference with the remaining switching elements among the plurality of switching elements 135 and 155.

Based on the above point, the controller 160 according to one embodiment may determine that the temperature failure condition occurs when the temperature difference between any one of the plurality of switching elements 135 and 155 and another one of the plurality of switching elements 135 and 155 exceeds a predetermined temperature difference for a predetermined time and perform temperature protection control. At this time, according to an embodiment, the controller 160 may adjust the predetermined temperature difference to be compared with the temperature difference between the switching elements in an increasing direction in proportion to the magnitude of the input current.

For example, when the second switching element 155 of the inverter 150 is incompletely fastened to the heat sink, as shown in FIG. 6, the temperature of the second switching element 155 may be rapidly increased compared to the temperature of the first switching element 135 of the converter 130. In this case, the controller 160 may determine the temperature failure condition when the temperature difference between the first switching element 135 and the second switching element 155 exceeding a predetermined temperature difference (e.g.: 25° C.) is maintained for a predetermined time (e.g.: 100 seconds) and perform temperature protection control. However, unlike that shown in FIG. 6, the temperature protection control may be performed based on the temperature difference between the plurality of second switching elements 155 and the temperature protection control may also be performed based on the temperature difference between the first switching elements 135.

According to an embodiment, the controller 160 may perform the temperature protection control by lowering the supplied current to the plurality of switching elements 135 and 155 when it is determined that the temperature failure condition occurs. For example, the controller 160 may control the switching of the plurality of switching elements 135 and 155 such that the switching frequency of the plurality of switching elements 135 and 155 decreases or the off time of the plurality of switching elements 135 and 155 increases. In addition, the controller 160, as shown in FIG. 6, sets the operating frequency at the load to 0 by turning off the plurality of switching elements 135 and 155 to terminate the supplied current to the load (e.g.: a compressor or a motor) for a certain period of time.

Furthermore, according to an embodiment, the controller 160 may perform temperature protection control by increasing the cooling performance of the cooling device 190 when it is determined that the temperature failure condition occurs. For example, the controller 160 may increase the cooling performance of the cooling device 190 by increasing the refrigerant flow rate of the cooling device 190 when the cooling device 190 is a refrigerant cooling-type cooling device. Also, the controller 160 may increase the cooling performance of the cooling device 190 by increasing the air volume of the cooling device 190 when the cooling device 190 is an air cooling-type cooling device.

According to an embodiment, the controller 160 may perform the temperature protection control multiple times, and when it is determined that the temperature failure condition occurs in the switching elements 135 and 155 even when the temperature protection control proceeds a predetermined number of times or more, the power supply operation may be terminated. For example, the controller 160, as shown in FIG. 7 may perform temperature protection control (for example, termination of current supply to the load (e.g.: a compressor) for a certain period of time) whenever the temperature failure condition is determined based on the temperature difference between the first switching element 135 and the second switching elements 155 and terminate the power supply operation when the temperature protection control is repeated a predetermined number of times or more.

Furthermore, according to an embodiment, the controller 160 may determine that the temperature failure condition occurs when the rate of increase of the temperature difference between any one of the plurality of switching elements 135 and 155 and another one of the plurality of switching elements 135 and 155 is equal to or greater than a predetermined rate and perform temperature protection control.

In other words, the controller 160 may determine that the temperature failure condition occurs when the variation amount of the temperature difference between the plurality of switching elements 135 and 155 exceeding a predetermined value is maintained for a predetermined time and perform temperature protection control.

In the above, performing the temperature protection control based on the temperature difference between the plurality of switching elements 135 and 155 has been described in detail. Hereinafter, an electronic device 1 including the power supply 10 will be described in detail.

Figure 8:
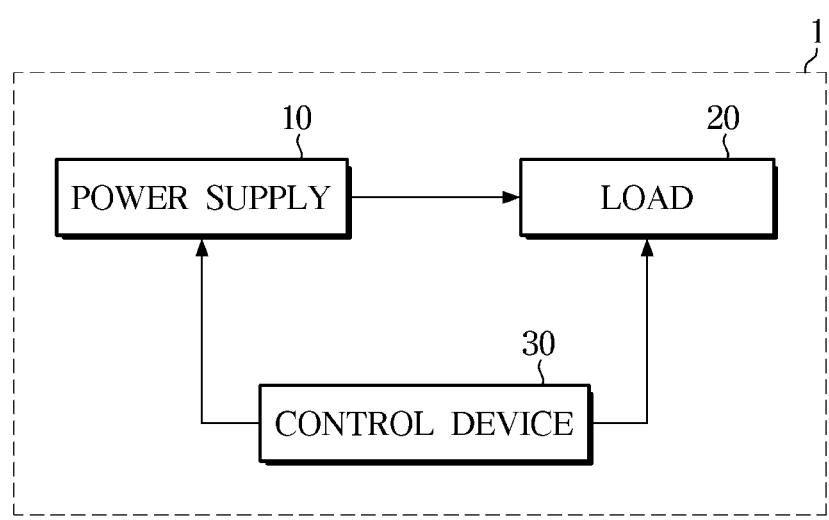
FIG. 8 is a control block diagram of an electronic device according to one embodiment.

FIG. 8 is a control block diagram of an electronic device according to one embodiment.

Referring to FIG. 8, an electronic device 1 according to one embodiment includes a power supply 10 for receiving an AC voltage from an external power source and supplying power to a load 20, the load 20 driven by receiving power, and a control device 30 for controlling the power supply 10 and the load 20.

The electronic device 1 may correspond to a home appliance that can be operated by receiving power, and may be, for example, an air conditioner, a washing machine, a dryer, a cooking appliance, etc.

The power supply 10 according to one embodiment may correspond to the power supply 10 described according to the embodiments of FIGS. 1 to 7.

In other words, the power supply 10 may determine whether a temperature failure condition occurs based on the temperature variation amount of each of the plurality of switching elements 135 and 155 or the temperature difference between the plurality of switching elements 135 and 155, and perform temperature protection control when it is determined that the temperature failure occurs.

The load 20 according to one embodiment may be driven based on an output voltage supplied from the power supply 10. For example, the load 20 may correspond to a compressor (not shown) or a motor (not shown), and the refrigerant may be compressed by changing an operating frequency under the control of the control device 30. In this way, the load 20 is a device that provides a required output to a user based on the output voltage supplied from the power supply 10, but is not limited to the above example, and there are no restrictions on its type.

At this time, the load 20 according to one embodiment may appear as resistance that varies according to operation and the control device 30 may adjust the magnitude of a predetermined voltage followed by a DC voltage according to the resistance value represented by the load 20 or control a switching cycle of the converter 130 to improve a power factor.

The control device 30 may be implemented as a memory for storing data for an algorithm or a program reproducing the algorithm for controlling the operation of components in the electronic device 1 and a processor for performing the above-described operation using the data stored in the memory. In addition, the control device 30 and the controller 160 of the power supply 10 may be implemented as a single chip.

Hereinafter, an embodiment of a method of controlling the power supply 10 according to one aspect will be described. The power supply 10 according to the above-described embodiment may be used in the control method of the power supply 10. Therefore, the contents described above with reference to FIGS. 1 to 8 may be equally applied to the method of controlling the power supply 10.

Figure 9:
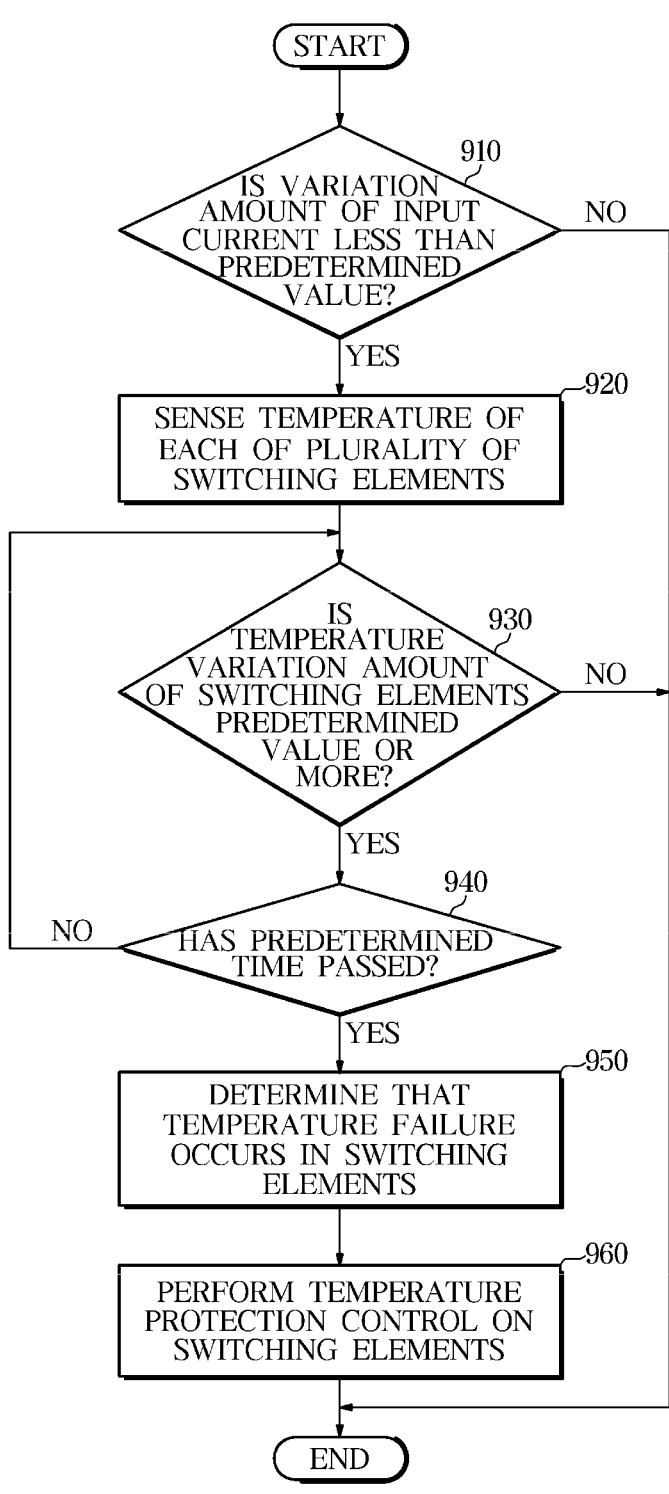
FIG. 9 is a flowchart illustrating a case of performing temperature protection control based on the temperature variation amount of a switching element in a method of controlling a power supply according to one embodiment.

FIG. 9 is a flowchart illustrating a case of performing temperature protection control based on the temperature variation amount of the switching elements 135 and 155 in a method of controlling the power supply 10 according to one embodiment.

Referring to FIG. 9, the power supply 10 according to one embodiment may detect the temperature of each of the plurality of switching elements 135 and 155 (920) when the variation amount of an input current is less than a predetermined value (Yes in 910).

That is, the power supply 10 may initiate an operation to determine whether the switching elements 135 and 155 are in a temperature failure condition in a situation where the input current variation is not large. In other words, the power supply 10 may determine a temperature failure condition based on the temperature variation amount of the switching elements 135 and 155 only when the input current is constant considering that the temperature of the switching elements 135 and 155 also varies when the input current is varied.

The power supply 10 according to one embodiment may determine that the temperature failure condition occurs in the switching element (950) when a condition where the temperature variation amount in any one of the plurality of switching elements 135 and 155 is equal to or greater than the predetermined value (Yes in 930) is maintained for a predetermined time (Yes in 940), and perform temperature protection control on the switching element (960).

Specifically, the controller 160 may determine that the temperature failure condition occurs in the corresponding switching element when the temperature variation amount in any one of the plurality of switching elements 135 and 155 included in each of the converter 130 and the inverter 150 being equal to or greater than the predetermined value is maintained for the predetermined time, and temperature protection control for cooling the corresponding switching element may be performed.

Figure 10:
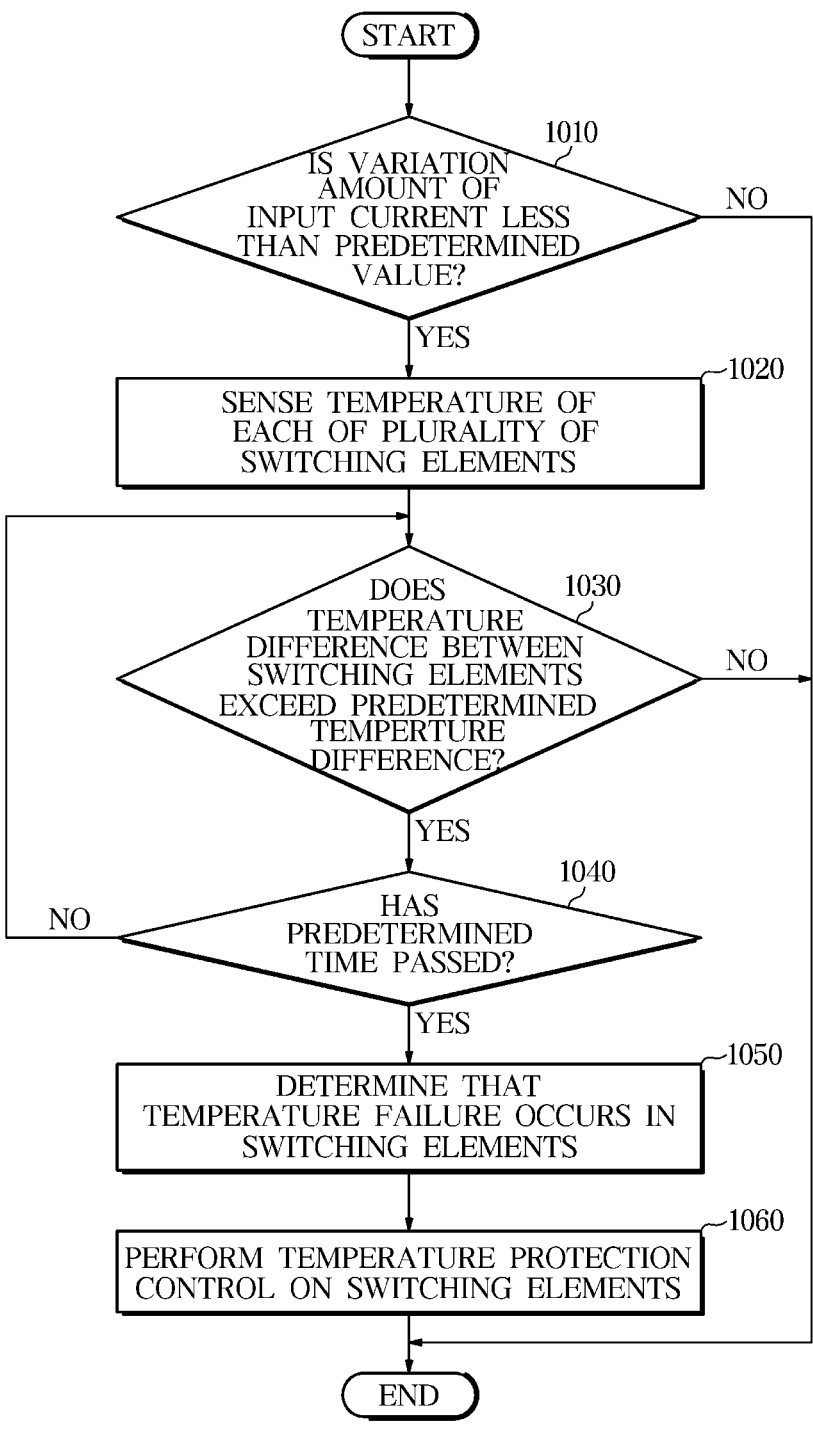
FIG. 10 is a flowchart illustrating a case of performing temperature protection control based on a temperature difference between switching elements in the method of controlling a power supply according to one embodiment.

FIG. 10 is a flowchart illustrating a case of performing temperature protection control based on the temperature difference between the switching elements 135 and 155 in a method of controlling the power supply 10 according to one embodiment.

Referring to FIG. 10, the power supply 10 according to one embodiment may detect the temperature of each of the plurality of switching elements 135 and 155 (1020) when the variation amount of the input current is less than the predetermined value (Yes in 1010).

That is, the power supply 10 may initiate an operation to determine whether the switching elements 135 and 155 are in a temperature failure condition in a situation where the input current variation is not large. In other words, the power supply 10 may determine that the temperature failure condition occurs based on the temperature difference between the switching elements 135 and 155 only when the input current is constant considering that the temperature of the switching elements 135 and 155 also varies when the input current is varied.

The power supply 10 according to one embodiment may determine that the temperature failure condition occurs (1050) when a condition where the temperature difference between the plurality of switching elements 135 and 155 exceeds a predetermined temperature difference (Yes in 1030) is maintained for a predetermined time (Yes in 1040), and perform temperature protection control on the switching element (1060).

Specifically, the controller 160 may determine that the temperature failure condition occurs when the temperature difference between any one of the plurality of switching elements 135 and 155 and another one of the plurality of switching elements 135 and 155 exceeds the predetermined temperature difference for a predetermined time and perform temperature protection control. At this time, according to an embodiment, the controller 160 may adjust the predetermined temperature difference to be compared with the temperature difference between the switching elements in an increasing direction in proportion to the magnitude of the input current or the input AC voltage.

Meanwhile, the disclosed embodiments may be implemented in the form of a recording medium storing instructions executable by a computer. Instructions may be stored in the form of program code, and when executed by a processor, operations of the disclosed embodiments can be executed by creating program modules. The recording medium may be implemented as a computer-readable recording medium.

Computer-readable recording media include all types of recording media in which instructions that can be decoded by a computer are stored. For example, there may be a read only memory (ROM), a random-access memory (RAM), a magnetic tape, a magnetic disk, a flash memory, an optical data storage, etc.

In the above, the disclosed embodiments have been described with reference to the accompanying drawings. Those skilled in the art to which the present disclosure pertains will understand that the present disclosure can be implemented in a form different from the disclosed embodiments without changing the technical scope or essential features of the present disclosure. The disclosed embodiments are illustrative and should not be construed as limiting.

What is claimed is:

1. An electronic device comprising:
a load that receives power and performs an operation; and
a power supply that supplies power to the load, the power supply including:
a rectifier configured to rectify an input alternating current (AC) voltage;
a converter including at least one first switching element and configured to convert the rectified input AC voltage into a direct current (DC) voltage;
an inverter including a plurality of second switching elements and configured to convert the DC voltage into an AC voltage;
a plurality of temperature sensors configured to detect a temperature of each switching element of the at least one first switching element and the plurality of second switching elements; and
a processor configured to determine whether a temperature failure occurs in at least one switching element of the at least one first switching element and the plurality of second switching elements based on a temperature difference between a switching element of the at least one first switching element and a switching element of the plurality of second switching elements, and perform temperature protection control on the at least one switching element based on determining that the temperature failure occurs.

2. The electronic device of claim 1, wherein the processor is configured to determine that the temperature failure occurs based on the temperature difference between the switching element of the at least one first switching element and the switching element of the plurality of second switching elements exceeding a predetermined temperature difference for a predetermined time.

3. The electronic device of claim 2, wherein the processor is configured to adjust the predetermined temperature difference in an increasing direction in response to the input AC voltage being increased.

4. The electronic device of claim 1, wherein the processor is configured to determine that the temperature failure occurs based on a variation amount of the temperature difference between the switching element of the at least one first switching element and the switching element of the plurality of second switching elements exceeding a predetermined value and being maintained for a predetermined time.

5. The electronic device of claim 1, wherein the processor is configured to perform the temperature protection control by lowering a supplied current to the at least one switching element based on determining that the temperature failure occurs.

6. The electronic device of claim 1, further comprising:
a cooling device configured to lower a temperature of each switching element of the at least one first switching element and the plurality of second switching elements,
wherein the processor is configured to perform the temperature protection control by increasing cooling performance of the cooling device based on determining that the temperature failure occurs.

7. The electronic device of claim 6, wherein the cooling device is a refrigerant cooling type cooling device, and the processor is configured to increase the cooling performance of the cooling device by increasing a refrigerant flow rate of the cooling device.

8. The electronic device of claim 6, wherein the cooling device is an air cooling type cooling device, and the processor is configured to increase the cooling performance of the cooling device by increasing an air volume of the cooling device.

9. The electronic device of claim 1, further comprising:
   a current sensor configured to detect an input current of the input AC voltage,
   wherein the processor is configured to determine whether the temperature failure occurs based on a variation amount of the input current being less than a predetermined value.

10. A method of controlling an electronic device including a load that receives power and performs an operation, and a power supply that supplies power to the load, a rectifier, a converter including at least one first switching element, and an inverter including a plurality of second switching elements, the method comprising:
   controlling the converter to convert an input alternating current (AC) voltage rectified by the rectifier into a direct current (DC) voltage following a predetermined voltage;
   controlling the inverter to convert the DC voltage into a three-phase voltage;
   detecting a temperature of each switching element of the at least one first switching element and the plurality of second switching elements;
   determining whether a temperature failure occurs in at least one switching element of the at least one first switching element and the plurality of second switching elements based on a temperature difference between a switching element of the at least one first switching element and a switching element of the plurality of second switching elements; and
   performing temperature protection control on at least one switching element based on determining that the temperature failure occurs.

11. The method of claim 10, wherein the determining of whether the temperature failure occurs includes determining that the temperature failure occurs based on the temperature difference between the switching element of the at least one first switching element and the switching element of the plurality of second switching elements exceeding a predetermined temperature difference for a predetermined time.

12. The method of claim 11, further comprising:
   adjusting the predetermined temperature difference in an increasing direction in response to the input AC voltage being increased.

13. The method of claim 10, wherein the determining of whether the temperature failure occurs includes determining that the temperature failure occurs based on a variation amount of the temperature difference between the switching element of the at least one first switching element and the switching element of the plurality of second switching elements exceeding a predetermined value and being maintained for a predetermined time.

14. The method of claim 10, wherein the performing of the temperature protection control includes performing the temperature protection control by lowering a supplied current to the at least one switching element based on determining that the temperature failure occurs.

15. The method of claim 10, wherein
   the power supply further includes a cooling device configured to lower a temperature of each switching element of the at least one first switching element and the plurality of second switching elements, and
   the performing of the temperature protection control includes performing the temperature protection control by increasing cooling performance of the cooling device based on determining that the temperature failure occurs.

16. The method of claim 15, wherein
   the cooling device is a refrigerant cooling type cooling device, and
   the performing of the temperature protection control includes increasing the cooling performance of the cooling device by increasing a refrigerant flow rate of the cooling device.

17. The method of claim 10 wherein
   the power supply further includes a current sensor configured to detect an input current of the input AC voltage, and
   the determining of whether the temperature failure occurs includes determining whether the temperature failure occurs based on a variation amount of the input current being less than a predetermined value.

18. An electronic device comprising:
   a load that receives power and performs an operation; and
   a power supply that supplies power to the load, the power supply including:
      a rectifier configured to rectify an input alternating current (AC) voltage;
      a converter including at least one first switching element and configured to convert the rectified input AC voltage into a direct current (DC) voltage;
      an inverter including a plurality of second switching elements and configured to convert the DC voltage into an AC voltage;
      a current sensor configured to detect an input current of the input AC voltage;
      a plurality of temperature sensors configured to detect a temperature of each switching element of the at least one first switching element and the plurality of second switching elements; and
      a processor configured to determine whether a temperature failure occurs in at least one switching element of the at least one first switching element and the plurality of second switching elements based on a temperature difference between a switching element of the at least one first switching element and a switching element of the plurality of second switching elements and a variation amount of the input current, and perform temperature protection control on the at least one switching element based on determining that the temperature failure occurs.

* * * * *